United States Patent
Tseng et al.

(10) Patent No.: US 7,362,107 B2
(45) Date of Patent: Apr. 22, 2008

(54) SYSTEMS AND METHODS FOR AUTOMATICALLY ELIMINATING IMBALANCE BETWEEN SIGNALS

(75) Inventors: Jui-Hsing Tseng, Hsin-Chu Hsien (TW); Yu-Ping Ho, Kao-Hsiung Hsien (TW)

(73) Assignee: MediaTek Inc., Hsin-Chu Hsien (TW)

( * ) Notice: Subject to any disclaimer, the term of this patent is extended or adjusted under 35 U.S.C. 154(b) by 88 days.

(21) Appl. No.: 11/164,029

(22) Filed: Nov. 8, 2005

(65) Prior Publication Data

US 2007/0118251 A1    May 24, 2007

(51) Int. Cl.
*G01R 35/00* (2006.01)

(52) U.S. Cl. ........................................ 324/601; 702/85
(58) Field of Classification Search ................ 324/601, 324/202, 74, 130, 600; 702/85
See application file for complete search history.

(56) References Cited

U.S. PATENT DOCUMENTS

| | | | | |
|---|---|---|---|---|
| 4,746,870 A * | 5/1988 | Underhill | ................ | 327/105 |
| 5,105,195 A * | 4/1992 | Conrad | ................ | 342/174 |
| 5,463,337 A * | 10/1995 | Leonowich | ................ | 327/158 |
| 5,646,519 A * | 7/1997 | Hamilton et al. | ........ | 324/76.82 |
| 6,081,145 A * | 6/2000 | Bandai et al. | ............... | 327/231 |
| 6,118,322 A * | 9/2000 | Bockelman et al. | ........ | 327/317 |
| 6,121,815 A * | 9/2000 | Terada et al. | ................ | 327/292 |
| 6,137,734 A | 10/2000 | Schoner et al. | | |
| 6,509,762 B1 | 1/2003 | Moss et al. | | |
| 6,675,117 B2 * | 1/2004 | Adam et al. | ................ | 702/106 |
| 6,889,334 B1 * | 5/2005 | Magro et al. | ................ | 713/500 |
| 6,931,338 B2 * | 8/2005 | Kattan | .......................... | 702/89 |
| 2003/0072393 A1 * | 4/2003 | Gu | ............................ | 375/322 |
| 2004/0145420 A1 * | 7/2004 | Knierim et al. | ............. | 331/1 A |

\* cited by examiner

*Primary Examiner*—Andrew H. Hirshfeld
*Assistant Examiner*—Hoai-An D. Nguyen
(74) *Attorney, Agent, or Firm*—Winston Hsu

(57) ABSTRACT

A calibrating system for automatically eliminating or reducing imbalance between a first signal and a second signal is disclosed. The calibrating system includes: a programmable delay module, receiving to the first and the second signals; a phase detecting module, coupled to the programmable delay module, for receiving the first and the second signals from the programmable delay module, and comparing a phase of a reference signal with phases of the first and the second signals, respectively; and a de-skew controlling module, coupled to the programmable delay module and the phase detecting module, for controlling the programmable delay module to eliminate imbalance between the first and the second signals by at least delaying the first signal according to a comparison result of the phase detecting module.

23 Claims, 8 Drawing Sheets

SYSTEMS AND METHODS FOR AUTOMATICALLY ELIMINATING IMBALANCE BETWEEN SIGNALS

BACKGROUND

The disclosure relates to a calibration system, and more particularly, to calibration systems and calibration methods for automatically eliminating imbalance between two or more signals.

Although the delay for each interface trace is expected to be exactly the same, in the actual circuit, the circuit layout may cause various lengths of delay (or skew) between parallel bus interfaces. For example, dynamic random access memory (DRAM) utilizes parallel buses to transfer data, known as data signals DQ, and data strobe signals, known as DQS. The data strobe signal DQS is utilized to access data carried by the data signal. Unfortunately, as mentioned previously, because of the skew caused by the circuit layouts, the signals transferred through different buses may travel through different paths. There are phase differences between these signals. Because of the phase differences, it is more difficult to utilize the data strobe signal to properly align the data signal DQ and to correctly recover the data from the data signal DQ.

Please refer to FIG. 1, which is a simplified diagram of a DRAM 100 outputting a plurality of signals. As shown in FIG. 1, the DRAM 100 outputs data signals DQ and data strobe signal DQS through parallel buses. As mentioned previously, the phase of each output signal DQ or DQS may be different from the remaining output signals due to various delay elements in each signal path.

A method for compensating the imbalances among the signals (including the DQ and DQS) is to utilize an oscilloscope to detect the phase differences among the signals. Once the phase differences are detected, programmable delays are utilized to delay individual signal such that the signals can be adjusted to have the same phase. Consequently, the data carried by the data signals may be fetched more correctly.

However, the aforementioned method does not sufficiently compensate for the measurement of the phase differences because of its reliance on humans. For example, designers must check the phases of the signals individually in an effort to adjust them.

SUMMARY OF THE INVENTION

Calibration systems and methods for automatically eliminating imbalance between two ore more signals are provided.

According to an exemplary embodiment, a calibrating system for automatically reducing or eliminating imbalance between a first signal and a second signal is disclosed. The calibrating system comprises a programmable delay module, a phase detecting module, and a de-skew controlling module. The programmable delay module receives the first and second signals, and the phase detecting module coupled to the programmable delay module, receives the first and second signals from the programmable delay module, and compares a phase of a reference signal with phases of the first and second signals, respectively. The de-skew controlling module coupled to the programmable delay module and the phase detecting module, controls the programmable delay module to eliminate imbalance between the first and second signals by at least delaying the first signal according to a comparison result of the phase detecting module.

According to another exemplary embodiment, a calibrating method for automatically reducing or eliminating imbalance between a first signal and a second signal is disclosed. The calibrating method comprises receiving the first and the second signals, comparing a phase of a reference signal with the phases of the first and the second signals, respectively, and eliminating imbalance between the first and the second signals by at least delaying the first signal according to a comparison result.

Regardless of the cause of the imbalance, for example, because of the trace differences or the different operational environments, the calibration system and calibration method for automatically reducing or eliminating imbalance between two signals can reduce imbalances of signals transferred through parallel buses or interface traces. Furthermore, the disclosed calibration system and related method thereof can automatically eliminate the imbalances. Therefore, the compensation of the skew (i.e., imbalances) can be achieved automatically and no longer depends on human intervention.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
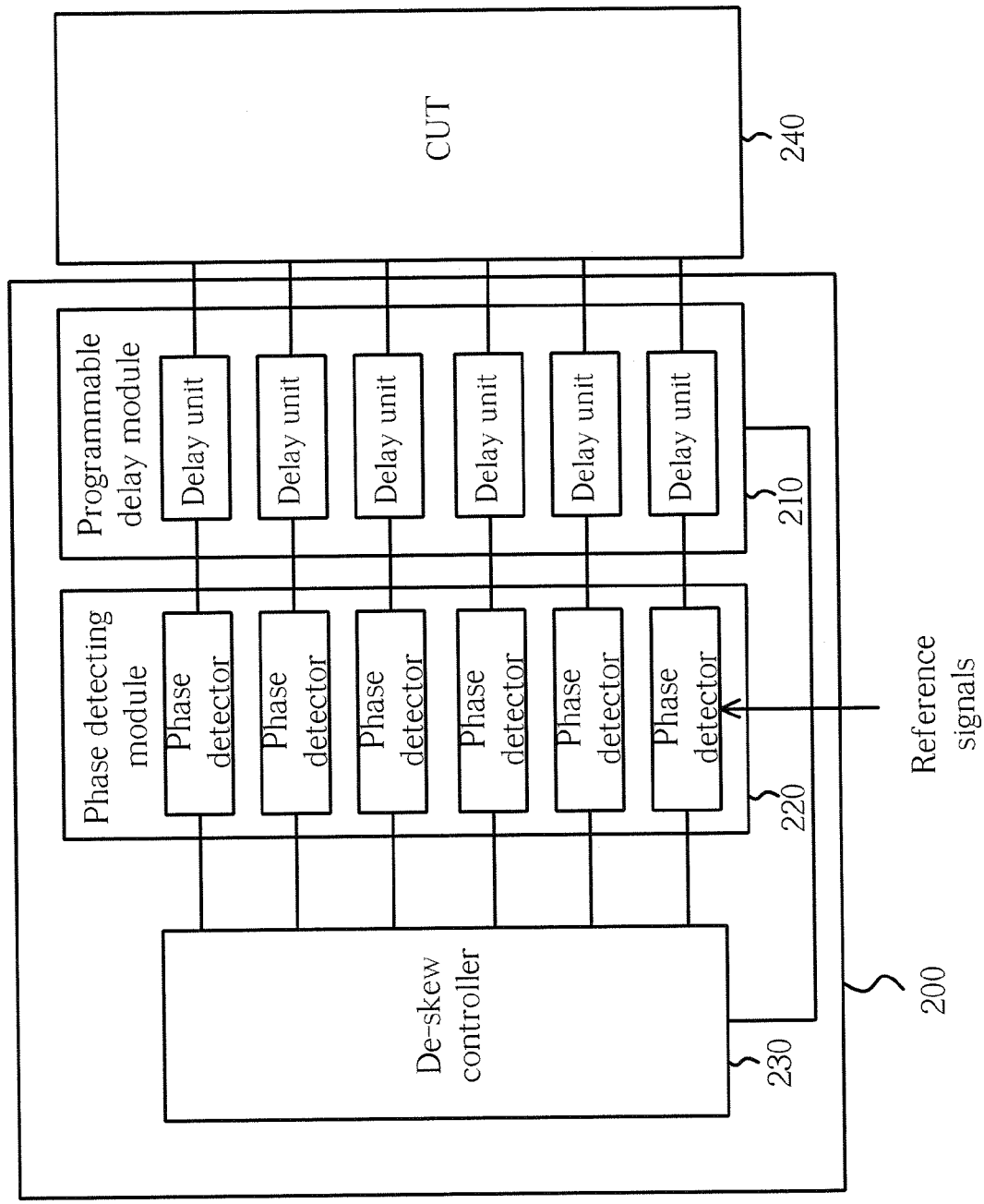
FIG. 2 is a functional block diagram of a calibration system for automatically eliminating the imbalances between signals.

Please refer to FIG. 2, which is a conceptual block diagram of a calibration system 200 for automatically eliminating the imbalances of signals. As shown in FIG. 2, the calibration system 200 comprises a programmable delay module 210, a phase detecting module 220 coupled to the programmable delay module 210, and a de-skew controller 230 coupled to the programmable delay module 210 and the phase detecting module 220.

Figure 1:
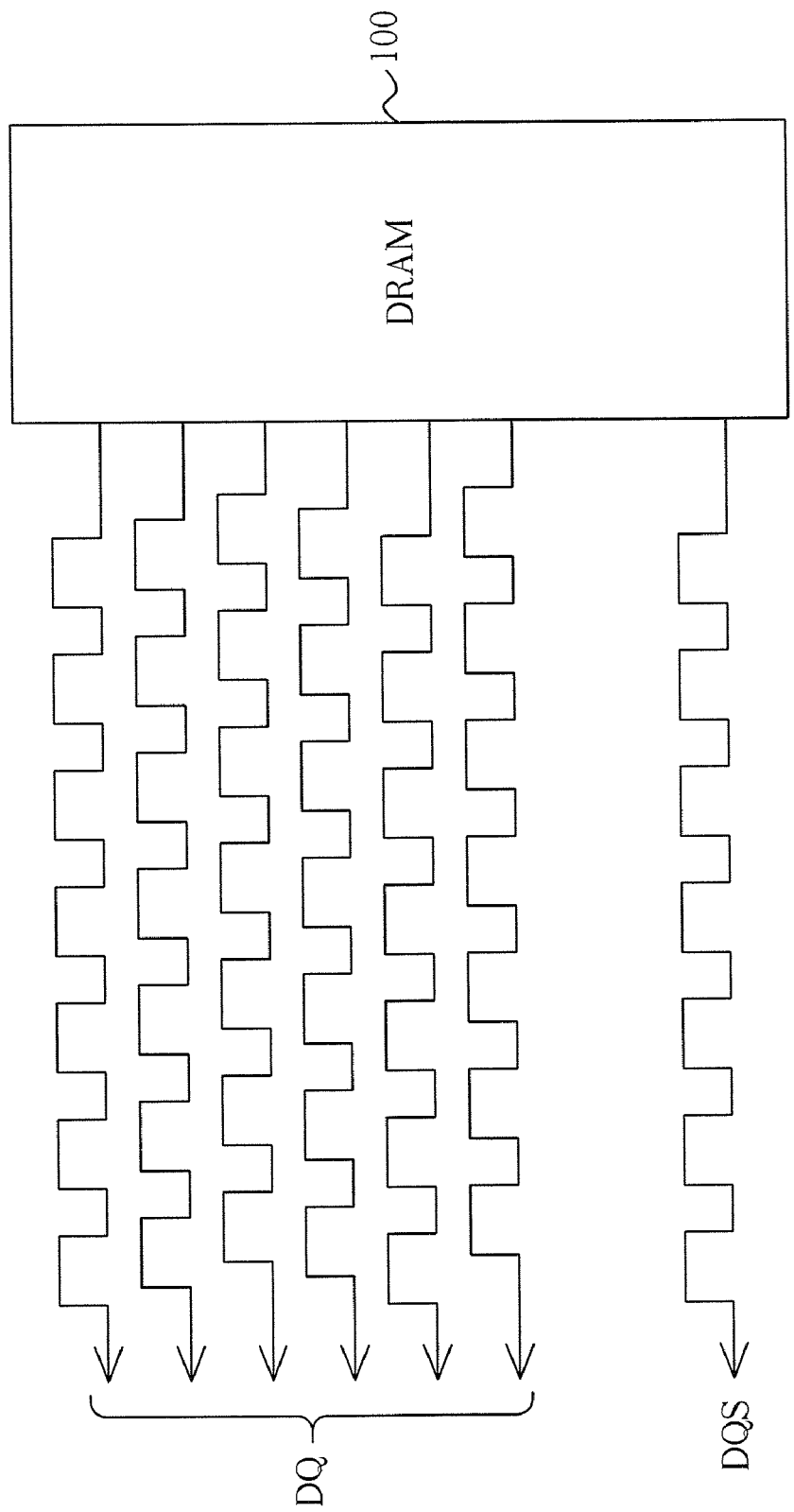
FIG. 1 is a simplified diagram of a dynamic random access memory (DRAM) outputting a plurality of signals.

In addition, a circuit under test (CUT) 240 is coupled to the calibration system 200. In this embodiment, the CUT 240 can be the aforementioned memory circuit (DRAM). As mentioned previously, the memory circuit 240 outputs signals, including data signals DQ and data strobe signals DQS, through a plurality of parallel buses. And the signals, for example as shown in FIG. 1, are imbalance due to various phase delays with respect to a reference signal.

In the embodiment shown in FIG. 2, the programmable delay module 210 comprises a plurality of programmable delay units. In addition, each delay unit is coupled to one of the parallel buses for receiving imbalanced signals from the DRAM 240. The phase detecting module 220 comprises a plurality of phase detectors. The phase detectors respectively compare the phase of a reference signal with phases of the received signals. The phase detecting module 220 is capable of determining the phase difference between the reference signal and any other signal, such as the received signals. Please note that the operation and the circuit of each phase detector is already well known by those skilled in the art, and are thus further explanation is omitted here. The de-skew controller 230 controls each delay unit of the delay module 210 according to the phase difference determined by the phase detecting module 220 in order to adjust the phase of each received signal. In this fashion, the imbalances of the signals can be eliminated. Some more detailed diagrams and descriptions of various embodiments of the calibration system are disclosed as follows.

Figure 3:
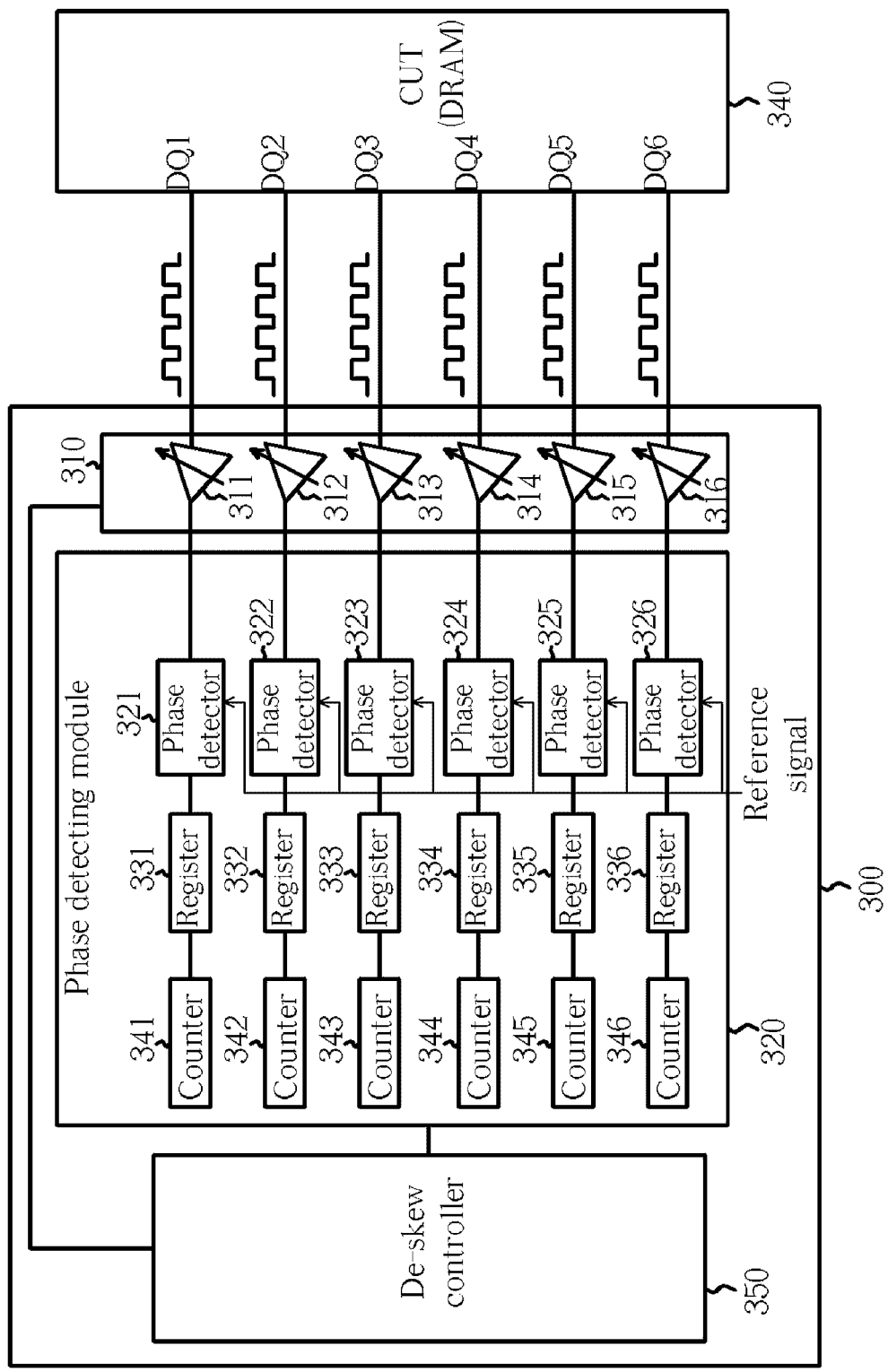
FIG. 3 is a diagram of a calibration system of a first embodiment.

Please refer to FIG. 3, which is a block diagram illustrating an embodiment of a calibration system 300. As shown in FIG. 3, the calibration system 300 comprises a programmable delay module 310, a phase detecting module 320, and a de-skew controller 350. Additionally, there is a CUT (DRAM) 340 coupled to the calibration system 300. However, the phase detecting module 320 not only comprises a plurality of phase detectors 321~326, but also a plurality of registers 331~336 and counters 341~346 for calculating and storing the phase difference between a reference signal and each received signal. This feature differentiates this embodiment as shown in FIG. 3 from the previous embodiment. The operation will be illustrated in the following disclosure.

First, the DRAM 340 outputs signals DQ1~DQ6 as shown in FIG. 3. As shown in FIG. 3, the signals DQ1~DQ6 are clock-like data for the calibration procedure. The clock-like data are generated, for example, by storing two inverted data into two locations in the DRAM 340 before the calibration procedure and recursively reading the two locations of the DRAM 340 when the calibration procedure is being performed. Therefore, the clock-like data can be outputted simultaneously on the parallel buses.

Please note that the clock-like data, shown as the data signals DQ1~DQ6 in FIG. 3, outputted by the DRAM 340 are not exactly in-phase with each other. The programmable delay module 310 receives the data signals DQ1~DQ6 for compensating the phase differences between the data signals DQ1~DQ6. Initially, no delay value has been set in each delay unit 311~316 of the programmable delay module 310, thus the delay module 310 directly transfers the data signals DQ1~DQ6 to the phase detecting module 320 without delaying any of the data signals DQ1~DQ6, such that the phase detecting module 320 receives the data signals DQ1~DQ6 output from the programmable delay module 310.

As mentioned previously, the phase detecting module 320 comprises a plurality of phase detectors 321~326. In this embodiment, the phase detecting module 320 can shift the reference signal periodically such that each phase detector 321~326 can utilize the periodically shifted reference signal to detect a transient of each data signal DQ1~DQ6.

Figure 4:
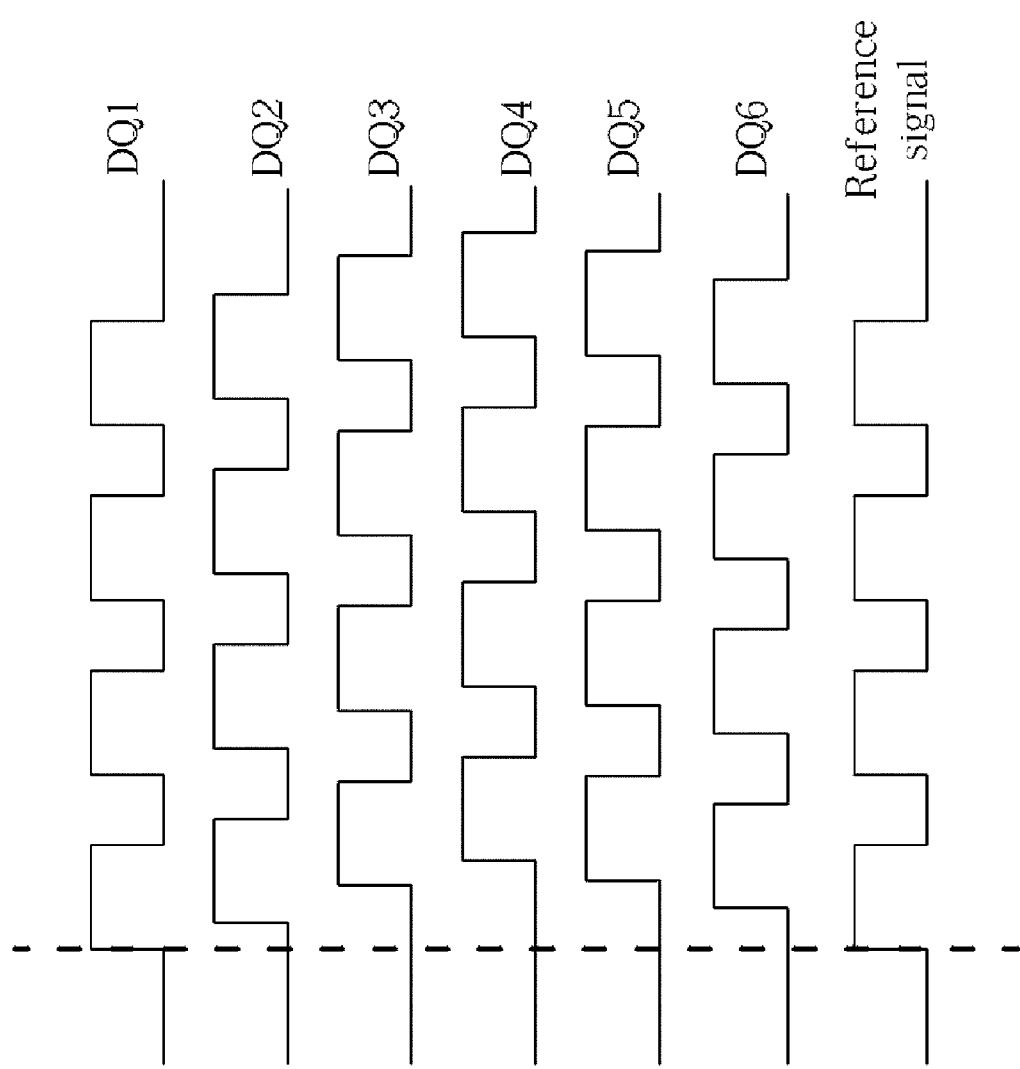
FIG. 4 is a timing diagram of the data signals and the reference signal.

Please refer to FIG. 4, which is a timing diagram of the data signals DQ1~DQ6 and the reference signal. As shown in FIG. 4, the reference signal can have a clock-like waveform or the reference signal can simply be a clock cycle shifted T periods (where the period T is determined by an inner clock). The dotted line in FIG. 4 indicates that the reference signal has aligned the transient of the data signal DQ1 (this means that the transient of the data signal DQ1 is detected).

Please note that in this embodiment, the phase detecting module 320 is utilized to shift the reference signal. However, the de-skew controller 330 also has the ability of shifting the reference signal. The reference signal may be shifted by the de-skew controller 350 and the phase detectors 321~326 detect transients of the data signal DQ1~DQ6 based on the reference signal shifted by the de-skew controller 350.

When one of the phase detectors 321~326, for example phase detector 322 detects that the reference signal aligns the transient of the corresponding data signal DQ2, the phase detector sets a register 332 coupled to the phase detector 322. When the register 332 is set, the corresponding counter 342 coupled to the register 332 starts to count a count value. The same operation is performed on the other data signals DQ2~DQ6 to calculate the phase difference between the reference signal and the data signals DQ2~DQ6. In some embodiments, the registers 331~336 are implemented by flip-flops.

Figure 5:
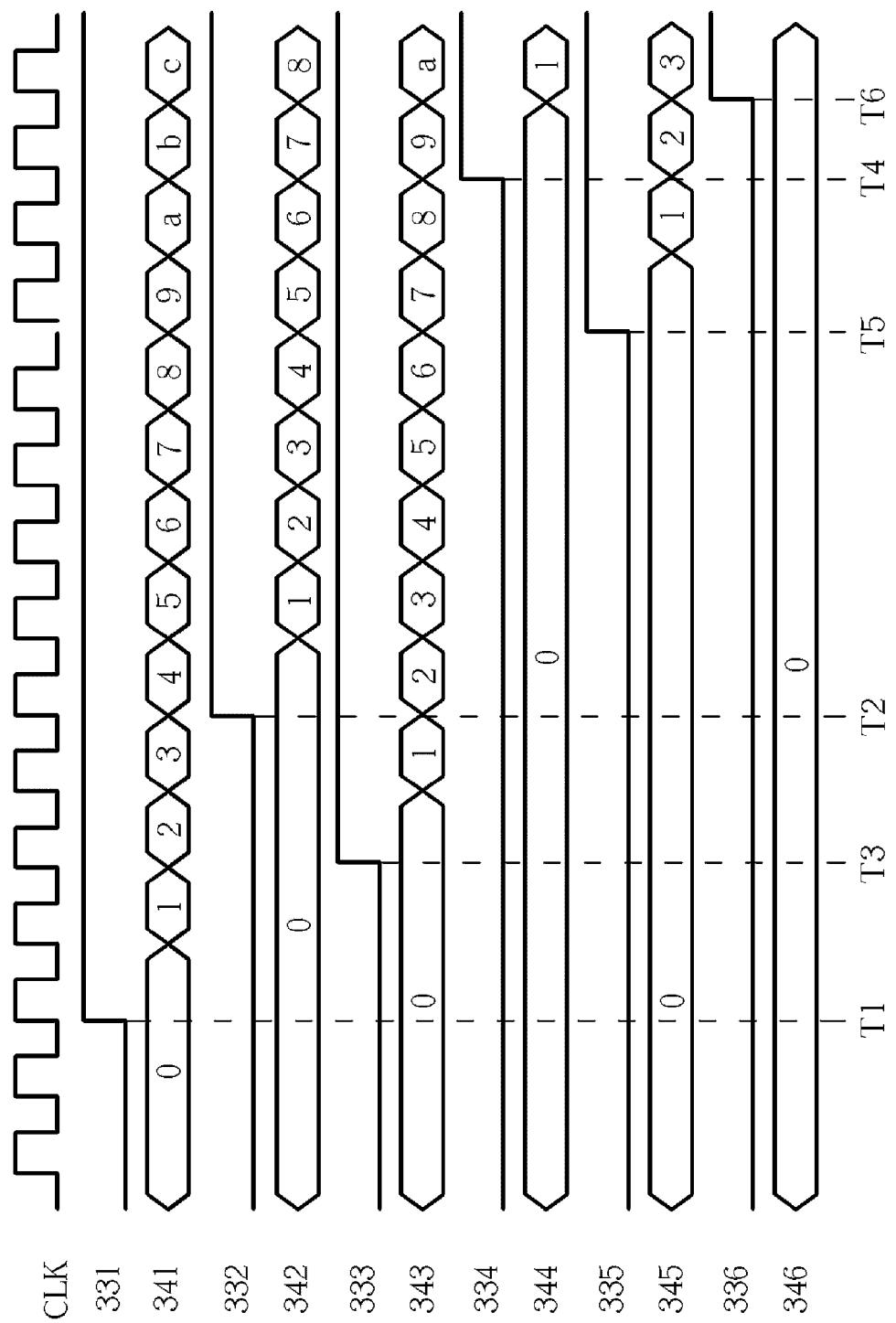
FIG. 5 is a diagram of the count value and the value stored in the register shown in FIG. 3.

Please refer to FIG. 5, which is a diagram illustrating the count values and the values stored in the registers. As shown in FIG. 5, the topmost signal is an inner clock CLK utilized for the counters 341~346. Assume that the reference signal aligns with the data signal DQ1 at time T1. As mentioned previously, the register 331 is set at time T1, and then the counter 341 starts incrementing the count value. Similarly, the reference signal aligns the data signal DQ3 at time T3 such that the register 333 is set at time T3, thus the counter 343 starts incrementing the count value after time T3.

Furthermore, the reference signal respectively aligns the remaining data signals DQ2, DQ5, DQ4, and DQ6. Therefore, the registers 332, and 334~336 are set at times T2, T4~T6 respectively, and their corresponding counters 342, 344~346 begins counting.

As long as the transients of all the data signals DQ1~DQ6 are detected, the phase difference between an edge of the reference signal and each corresponding edge of the data signals DQ1~DQ6 is stored as a count value in the counters 341~346. In this embodiment, if all of the registers 331 336 are set, indicating all the transients are detected, which means that all the data signal DQ1~DQ6 had been phase aligned with the reference signal, the de-skew controller 350 stops the counters 341~346. Furthermore, the de-skew controller 350 utilizes the count values stored in the counters 341~346 as the trace difference between any of the data signals and the most delayed data signal. The count values are provided as feedback to the programmable delay module 310, and each of the delay units 311~316 is set according to the corresponding count value.

According to the example shown in FIG. 5, the counter 341 has a count value 12 ("c" in hexadecimal) such that the corresponding delay unit 311 is set according to the count value 12. That is, the data signal DQ1 is delayed 12 inner clock cycles by the delay unit 341. Similarly, each of the data signals DQ2~DQ6 is respectively delayed 8, 10, 1, 3, and 0 inner clock cycles according to the count values. All the data signals DQ1~DQ6 are adjusted through the delay units 311~316, and the delayed data signals DQ1~DQ6 output from the delay units 311~316 are expected to be in phase without any phase difference. In other words, the imbalances of the data signals DQ1~DQ6 are eliminated.

Embodiments of the invented systems and methods derive the relative delay of each data signal or data strobe signal to determine the timing skews among the signals. In the above-mentioned embodiment, the disclosed invention provides a simple method for detecting the phase difference between each signal and a reference signal simultaneously. Each signal starts counting when it is aligned with the reference signal, and when the last signal is aligned with the reference signal, the count value corresponds to each signal is utilized as an index for compensating the phase difference.

Determining and compensating the phase difference can be accomplished by using only the most simple and cheap components, such as registers, counters, and phase detectors. The count values is equally fundamental as it is determined when the reference signal aligns the transient of each signal. As a result, the disclosed methods and systems can be easily utilized and implemented in many applications requiring multi-traces de-skewing.

In the above-mentioned embodiment, each of the counters 341~346 is a 4-bit counter. That is, the count value can only vary between 0 and 15. Please note that the bit number of the counters 341~346 is only utilized as an embodiment, not a limitation. The counters 341~346 can be designed as counters having larger bit numbers and the frequency of the inner clock can be designed as being larger such that the calibration system 300 can attain more accurate resolution. In other words, the calibration system 300 can have different resolutions by assigning different bit numbers and inner clocks according to various design rules.

In the embodiment shown in FIG. 3, the calibration system 300 is utilized for calibrating the imbalances of the data signals. Surely, the calibration system 300 can also calibrate the imbalances of a data strobe signal at the same time. As mentioned previously, the data strobe signals are utilized to fetch data from the data signals DQ. Therefore, the data strobe signals must be well aligned to the data signals.

Figure 6:
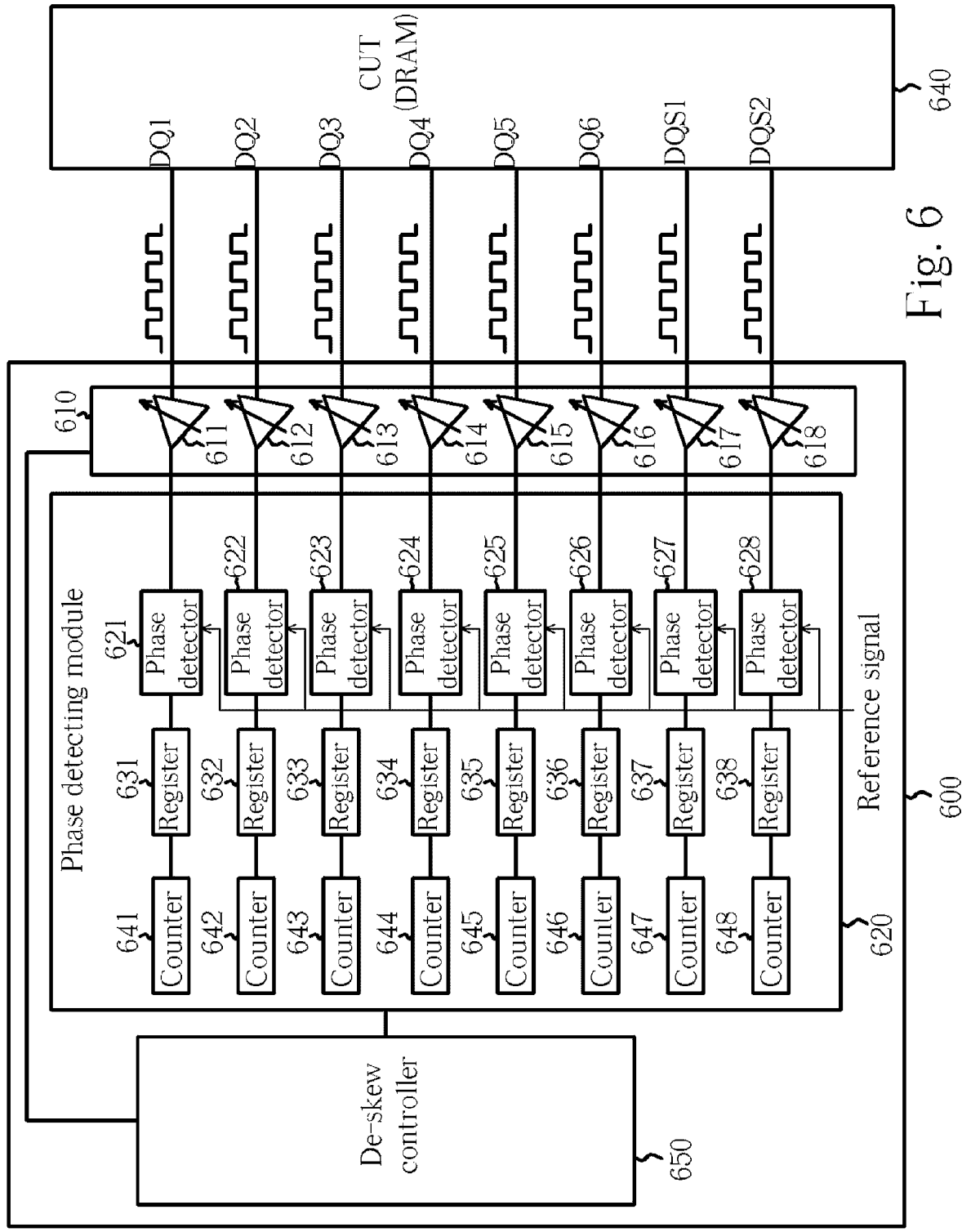
FIG. 6 is a calibration system of a second embodiment.

Please refer to FIG. 6, which is a calibration system 600 of another embodiment. The calibration system 600 receives the data signals DQ1~DQ6 and data strobe signals DQS1~DQS2 at the same time from the CUT (DRAM) 640. Because the data strobe signals DQS1~DQS2 should be well aligned to the data signals DQ1~DQ6 and the data signals DQ1~DQ6 must also align to each other, the calibration system 600 can utilize the same calibrating mechanism as the above-mentioned calibration system 300. Thus, further illustration is omitted here.

Figure 7:
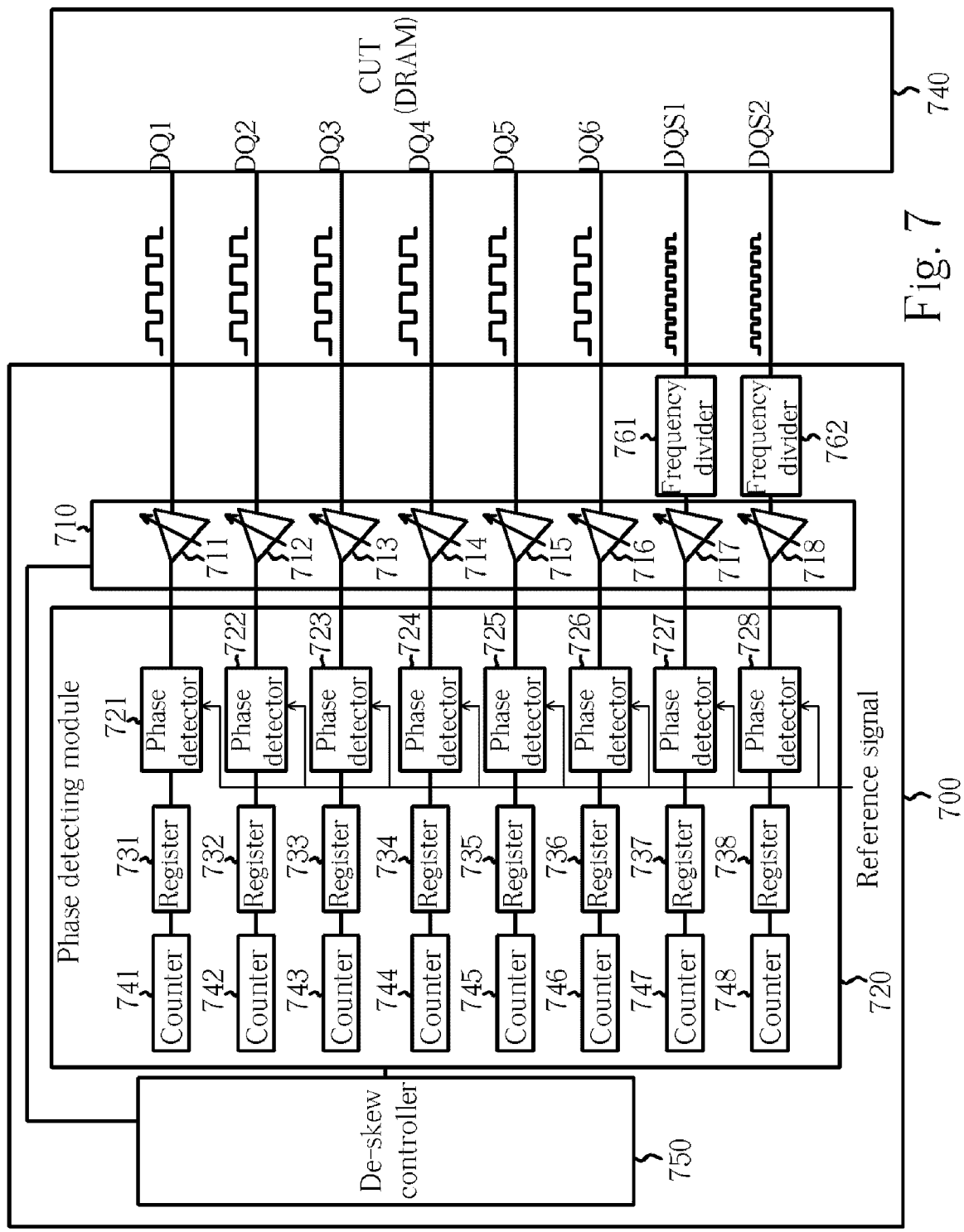
FIG. 7 is a calibration system of a third embodiment.

Please refer to FIG. 7, which is a calibration system 700 of an embodiment. Since the frequency of the data strobe signals DQS1 and DQS2 are twice of the frequency of the data signals DQ1~DQ6, before the data strobe signals DQS1 and DQS2 are received by the programmable delay module 710, the frequency of the data strobe signals DQS1 and DQS2 are divided by frequency dividers 761 and 762. Each of the data strobe signals DQS1 and DQS2 thus has the same frequency as the data signals DQ1~DQ6. In addition, the operation of the calibration system 700 is similar to the above-mentioned calibration system 300, therefore further illustration is omitted here.

Figure 8:
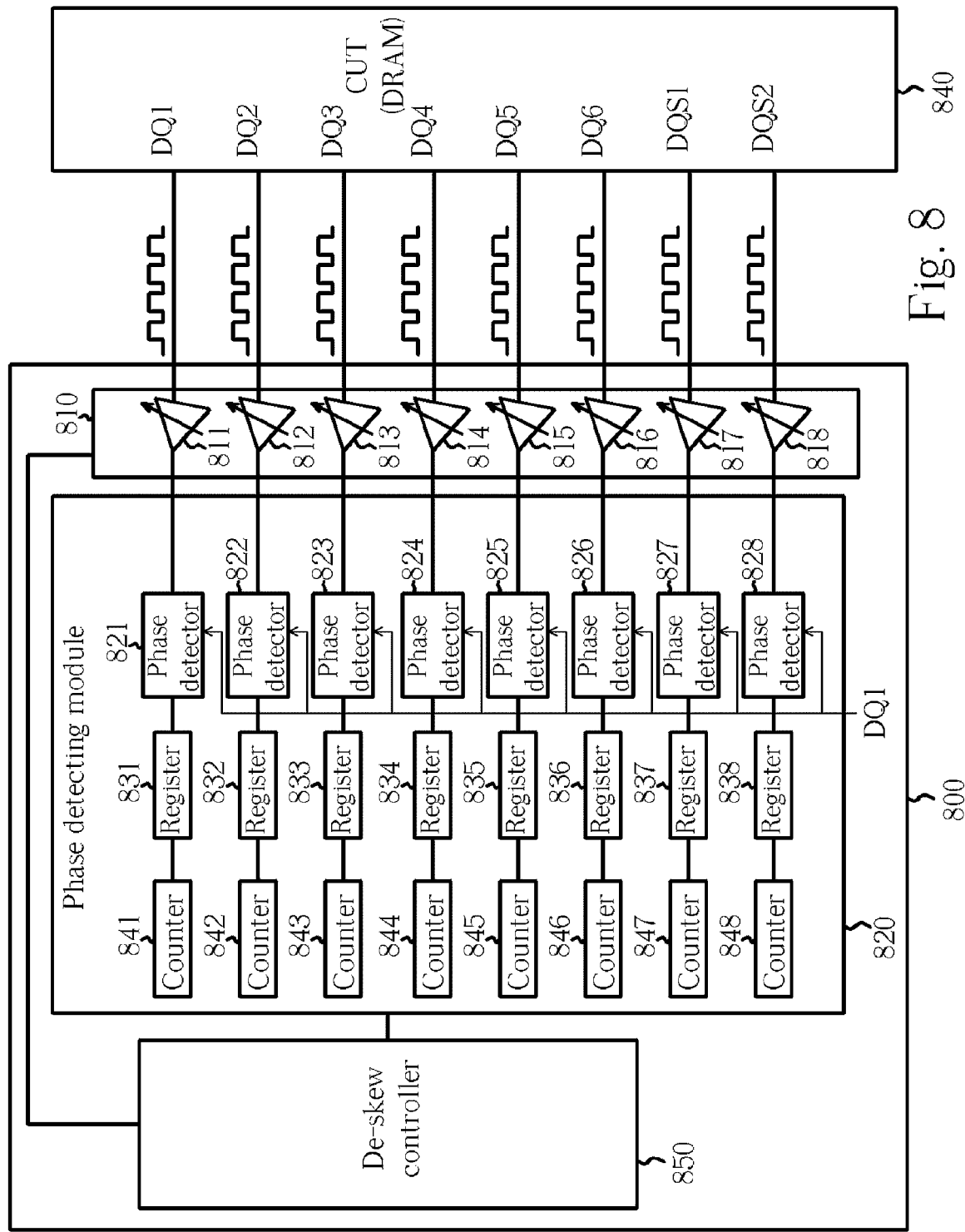
FIG. 8 is a calibration system of a fourth embodiment.

In addition, in the above-mentioned embodiments, the phase detecting modules 320, 620, and 720 utilize a reference signal to detect the transients. However, in some implementations, each of the data signals DQ1~DQ6 can be utilized as the reference signal. Please refer to FIG. 8, which is a calibration system 800 of another embodiment. In this embodiment, the data signal DQ1 is utilized as the reference signal, so the phase detecting module 820 utilizes the data signal DQ1 to detect transients of other signals (including the data signals DQ1~DQ6 and the data strobe signals DQS1~DQS2) received from the parallel buses. The operation of the calibration system 800 is also similar to the previously described calibration system. For example, each of the counters 841~848 starts counting when each of the phase detectors 821~828 detects a transient of the signals DQ1~DQ6 and DQS1~DQS2, and stops counting when all the transients are detected. Finally, the stored count values are feedback to the programmable delay module 810. Please note that since the data signal DQ1 is utilized as the reference signal, the count value of the counter 841 should have the largest count value.

In addition, in the above-mentioned embodiments, each counter starts counting when a transient of a corresponding signal is aligned and stops counting when transients of all corresponding signals are aligned. However, we can utilize another mechanism, for example, we can define all counters to start counting when one of the transient is detected, and each counter to stop counting when the transient of the corresponding signal is detected. This change also obeys the spirit of the disclosure.

Moreover, the number of counters does not necessary to be equal to the number of signals output from the parallel bus, as it can be reduced. For example, each counter can be defined to start counting when a transient of a certain signal is detected and to stop when a corresponding signal is detected. For example, please refer again to FIG. 3. If the counter 341 is ignored, the other counters 342~346 start counting when the transient of the data signal DQ1 is detected and stop counting when the transient of each corresponding signals DQ2~DQ6 is detected. Therefore, the counter 341 is no longer utilized.

Furthermore, in the aforementioned embodiments, multiple phase detectors, registers, and counters are utilized to simultaneously measure the phase differences. But we can utilize only one phase detector, one register, and one counter to sequentially measure a phase difference of each signal DQ1~DQ6 and DQS1~DQS2. One of the concerns is that an addition storage device is needed to store the measurement results of signals such that the de-skew controller can feedback the measurement results (e.g., count values), stored in the storage device, to the delay units. This change also obeys the spirit of the disclosure.

Please note that the count values can be utilized to compensate for the imbalances of not only the output path of the signals, but also the input path of the signals. That is, the calibration system can measure the imbalances of the input signals on the parallel buses. For example, as mentioned previously, the calibration system utilizes the count values as the index of the phase differences between each signal and the reference signal. These count values are therefore used to compensate for the imbalances or skew of the input data signals and data strobe signals. Since the calibration system is capable of fetching data from the DRAM, it is utilized as a memory controller. The calibration system sends some control signals to the DRAM to fetch data. At this time, the count values can also be utilized to compensate for the signals transferring from the calibration system to the DRAM. For example, the calibration system may comprise another programmable delay module for delaying the signals transferred from the calibration system to the DRAM such that the imbalances of the signals are eliminated or reduced.

Furthermore, in the above-mentioned embodiments, the input data signals DQ1~DQ6 or the data strobe signals DQS1~DQS2 are continuous clock-like data. In actual implementation, a pulse is sometimes enough for predicting the phase differences of the signals DQ1~DQ6 and DQS1~DQS2. For example, the DRAM can output signals with a few, or one clock cycle. That is, in this case, the reference signal is used to begin detecting the actual transients using various predicted transient timings of the clock-like data output from the DRAM. The calibration system is still capable of compensating for the imbalances by analyzing these signals having fewer clock cycles.

Please note that the DRAM is only utilized as an exemplary unit with parallel buses interface, and should not be a limitation. That is, the calibration system is not only designed to compensate for imbalances of signals output from DRAM, but also compensates for signals transferred through any parallel buses.

In contrast to the related art, regardless of what has caused the imbalance, either the trace differences or different operational environments, embodiments of the calibration method can eliminate imbalances of signals transferred through parallel buses, and thus the skew (i.e., imbalances) compensation can be achieved automatically and no longer depends on human intervention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calibrating system for automatically eliminating imbalance between a first input signal and a second input signal, the calibrating system comprising:
   a programmable delay module, receiving the first and the second input signals and outputting a first output signal and a second output signal respectively;
   a phase detecting module, coupled to the programmable delay module, for receiving the first and the second output signals from the programmable delay module, and comparing a phase of a reference signal with phases of the first and the second output signals, respectively; and
   a de-skew controlling module, coupled to the programmable delay module and the phase detecting module, for controlling the programmable delay module to eliminate or reduce imbalance between the first and the second output signals by at least delaying one of the first input signal and the second input signal according to a comparison result of the phase detecting module.

2. The calibrating system of claim 1, wherein the reference signal is the first input signal.

3. The calibrating system of claim 1, wherein the de-skew controlling module sequentially shifts the phase of the reference signal, and after each shifting, the phase detecting module compares the phase of the shifted reference signal with phases of the first and the second output signals to determine if a transient of the first or second output signal is aligned with the shifted reference signal.

4. The calibrating system of claim 1, wherein the phase detecting module compares the phase of the reference signal with phases of the first and the second output signals by periodically shifting the reference signal to detect a transient of the first output signal and a transient of the second output signal.

5. The calibrating system of claim 1, wherein the phase detecting module comprises:
   a first phase detecting unit for detecting the transient of the first output signal utilizing the reference signal;
   a second phase detecting unit for detecting the transient of the second output signal utilizing the reference signal; and
   a first counter, starts counting a first count value serving as the comparison result when the first phase detecting unit detects the transient of the first output signal, and the first counter stops counting when the second phase detecting unit detects the transient of the second output signal.

6. The calibrating system of claim 1, wherein the phase detecting module comprises:
   a first phase detecting unit for detecting the transient of the first output signal utilizing the reference signal;
   a second phase detecting unit for detecting the transient of the second output signal utilizing the reference signal;
   a first counter, starts counting a first count value when the first phase detecting unit detects the transient of the first output signal, and stops counting when all the transient of the signals are detected; and
   a second counter starts counting a second count value when the second phase detecting unit detects the transient of the second output signal, and stops counting when all the transient of the signals are detected;
   wherein the first and the second count values serve as the comparison result.

7. The calibrating system of claim 6, wherein one of the first and second phase detecting units detects the transient of the signal by checking if the signal is aligned with the reference signal.

8. The calibrating system of claim 6, wherein the de-skew controller programs the programmable delay module for delaying the first input signal according to the first count value, and programs the programmable delay module for delaying the second input signal according to the second count value.

9. The calibrating system of claim 1, wherein the first and second input signals are outputted from a dynamic random access memory (DRAM).

10. The calibrating system of claim 9, wherein at least one of the first and the second input signals is a data signal (DQ).

11. The calibrating system of claim 9, wherein at least one of the first and the second input signals is a data strobe signal (DQS).

12. The calibration system of claim 9, wherein the calibration system is embedded inside a memory controller capable of sending control signals having imbalances to fetch data from the DRAM, the calibration system further comprises an output programmable delay module coupled to the de-skew controller and capable of delaying at least one of the control signals, and the de-skew controller further controls the output programmable delay module to eliminate or reduce imbalance between the control signals by at least delaying one signal according to the comparison result of the phase detecting module.

13. A calibrating method for automatically eliminating or reducing imbalance between a first signal and a second signal, the calibrating method comprising:
   receiving the first and the second signals;
   comparing a phase of a reference signal with phases of the first and the second signals, respectively;
   eliminating or reducing imbalance between the first and the second signals by delaying at least one of the first and the second signals according to a comparison result to generate resultant first and second signals; and
   outputting the resultant first and second signals.

14. The calibrating method of claim 13, wherein the reference signal is the first signal.

15. The calibrating method of claim 13, wherein the step of comparing the phase of the reference signal with phases of the first and the second signals is performed by periodically shifting the reference signal to detect a transient of the first signal and a transient of the second signal.

16. The calibrating method of claim 15 further comprising:
   utilizing a counter to start counting when the transient of the first signal is detected, and to stop counting when the transient of the second signal is detected in order to generate a first count value serving as the comparison result.

17. The calibrating method of claim 15 further comprising:
utilizing a first counter to start counting when the transient of the first signal is detected in order to generate a first count value; and
utilizing a second counter to start counting when the transient of the second signal is detected in order to generate a second count value;
wherein the first and the second count values serve as the comparison result.

18. The calibrating system of claim 17, further comprising:
detecting the transient of one of the first and the second signals by checking if the signal is aligned with the reference signal.

19. The calibrating system of claim 17, further comprising:
delaying the first signal according to the first count value, and delaying the second signal according to the second count value.

20. The calibrating method of claim 13, wherein the first and the second signals are outputted from a dynamic random access memory (DRAM).

21. The calibrating method of claim 20, wherein the first and the second signals are data signals (DQ).

22. The calibrating method of claim 20, wherein the first and the second signals are data strobe signals (DQS).

23. The calibration method of claim 20, further comprising:
eliminating or reducing imbalance between control signals, which are utilized to fetch data from the DRAM, by at least delaying one of the control signals according to the comparison result to generate resultant control signals; and
outputting the resultant control signals.

* * * * *